(12) United States Patent
Lung

(10) Patent No.: US 8,164,146 B2
(45) Date of Patent: Apr. 24, 2012

(54) SUBSTRATE SYMMETRICAL SILICIDE SOURCE/DRAIN SURROUNDING GATE TRANSISTOR

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 106 days.

(21) Appl. No.: 12/565,625

(22) Filed: Sep. 23, 2009

(65) Prior Publication Data

US 2011/0068418 A1   Mar. 24, 2011

(51) Int. Cl.
  H01L 29/78    (2006.01)
  H01L 21/44    (2006.01)
(52) U.S. Cl. ......... 257/413; 257/E29.255; 257/E21.211; 438/682
(58) Field of Classification Search .................. 257/413, 257/E29.255, E21.211, E21.409, 412, 213, 257/288; 438/294, 682, 299, 630
See application file for complete search history.

(56) References Cited

U.S. PATENT DOCUMENTS

| | | | |
|---|---|---|---|
| 6,011,272 A | 1/2000 | Omid-Zohoor et al. | |
| 6,649,976 B2 | 11/2003 | Iwamatsu et al. | |
| 6,653,733 B1 | 11/2003 | Gonzalez et al. | |
| 6,720,240 B2 | 4/2004 | Gole et al. | |
| 6,737,675 B2 | 5/2004 | Patel et al. | |
| 6,815,298 B2 | 11/2004 | Tsuchiaki | |
| 6,831,017 B1 | 12/2004 | Li et al. | |
| 6,891,235 B1 | 5/2005 | Furukawa et al. | |
| 7,081,377 B2 | 7/2006 | Cleeves | |
| 7,116,593 B2 | 10/2006 | Hanzawa et al. | |
| 7,129,538 B2 | 10/2006 | Lee et al. | |
| 7,365,385 B2 | 4/2008 | Abbott | |
| 2001/0055838 A1 | 12/2001 | Walker et al. | |
| 2003/0189202 A1 | 10/2003 | Li et al. | |
| 2006/0017088 A1 | 1/2006 | Abbott et al. | |
| 2006/0246676 A1 * | 11/2006 | Fujiishi | 438/386 |
| 2010/0171086 A1 | 7/2010 | Lung et al. | |
| 2010/0171188 A1 | 7/2010 | Lung et al. | |

OTHER PUBLICATIONS

Auth, Chris, et al., "45nm High-k+Metal Gate Strain-Enhanced Transistors," Intel Technology Journal, vol. 12, Issue 02, Jun. 17, 2008, 12 pages.
Goebel, B, et al., "Fully Depleted Surrounding Gate Transistor (SGT) for 70 nm DRAM and Beyond," Dec. 9-11, 2002, IEEE, IEDM, 4 pages.
Lu, Wei, et al., "One-dimensional hole gas in germanium/silicon nanowire heterostructures," PNAS, vol. 102, No. 29, Jul. 19, 2005, 6 pages.
Maeda, S., et al., A Vertical F-Shape Transistor (VFT) Cell for 1Gbit DRAM and Beyond, 1994 Symp. on VLSI Technology, Jun. 7-9, 1994, 2 pages.

* cited by examiner

*Primary Examiner* — A. Sefer
*Assistant Examiner* — Nikolay Yushin
(74) *Attorney, Agent, or Firm* — Haynes Beffel & Wolfeld LLP

(57) ABSTRACT

Field effect transistors described herein include first and second terminals vertically separated by a channel region. The first and second terminals comprise first and second silicide elements respectively. The first silicide element prevents the migration of carriers from the first terminal into the underlying semiconductor body or adjacent devices which can activate parasitic devices. The first silicide element is also capable of acting as a low resistance conductive line for interconnecting devices or elements. The second silicide element provides a low resistance contact between the second terminal and overlying elements.

20 Claims, 22 Drawing Sheets

SUBSTRATE SYMMETRICAL SILICIDE SOURCE/DRAIN SURROUNDING GATE TRANSISTOR

BACKGROUND

1. Field of the Invention

The present invention relates to high density integrated circuit devices including buried silicide conductors, and to methods for manufacturing such devices.

2. Description of Related Art

One common technology for interconnecting components on integrated circuits is the use of buried diffusion lines, which consist of lines of implanted dopants in relatively high concentration, so that they act as electrical conductors in the substrate.

A problem that arises with the use of buried diffusion lines is the loading effect due to their relatively high resistance. In operation, the relatively large resistance of the implanted dopants compared to that of metal results in increased power consumption and a reduction in the operation speed of the device. As a result, various techniques have been used to reduce the loading effect of the buried diffusion lines.

One approach is to reduce the resistance of the lines by increasing the dopant concentration. However, increasing the dopant concentration also increases the diffusion of the dopants into the substrate, making the implantation process more difficult to control. This can result in a loss of the desired pattern for the line, and limits the spacing between the lines.

Another approach to reducing the loading effect is to implement lower resistivity metal lines in parallel with the buried diffusion lines. Typically, the metal lines are formed on a dielectric layer overlying the buried diffusion lines. A series of metal contacts at intervals along a buried diffusion line extend through the dielectric layer to establish contact with a corresponding metal line. While parallel metal lines assist in reducing the loading effect of the buried diffusion lines, the metal lines and contacts can limit the density of the device and increase complexity of designs and manufacturing processes.

Silicides are also commonly used in integrated circuit manufacturing to increase the conductivity of doped lines or elements. A common version of the material is referred to as a "salicide", changing the first two letters of the word to "sa-", in a reference to self-aligned techniques for forming the material on the chip. A self-aligned process for forming silicide involves depositing a silicide precursor over a substrate that includes exposed regions of silicon, and annealing the silicide precursor to form a silicide in the exposed regions. Then the remaining silicide precursor on the substrate is removed, leaving the self-aligned silicide elements. Typical silicide precursors include metals or combinations of metals such as cobalt, titanium, nickel, molybdenum, tungsten, tantalum, and platinum. Also, silicide precursors may include metal nitrides or other metal compounds. Representative uses of silicide in integrated circuit manufacturing are shown in U.S. Pat. Nos. 7,365,385; 7,129,538; 7,081,377; 6,891,235; 6,815,298; 6,737,675; 6,653,733; 6,649,976; and 6,011,272; in U.S. Patent Publication Nos. 2001/0055838; and 2006/0017088. See also U.S. patent application Ser. Nos. 12/349903, and 12/349874, both applications commonly owned by the assignee of the present application and incorporated by reference herein.

Additionally, it is desirable to reduce the cross-sectional area or footprint of individual memory cells in an array of memory cells in order to achieve higher density memory devices. However, traditional field effect transistor access devices are horizontal structures having a horizontally oriented gate overlying a horizontally oriented channel region, resulting in the field effect transistors having a relatively large cross-sectional area which limits the density of the array. Attempts at reducing the cross-sectional area of horizontally oriented field effect transistors can result in issues in obtaining the current needed to induce phase change because of the relatively low current drive of field effect transistors. Thus, memory devices having vertically oriented field effect access devices have been proposed. See, for example, U.S. Pat. No. 7,116,593.

Accordingly, it is desirable to provide high density devices and methods for manufacturing such devices addressing the loading effect issues of doped semiconductor lines. In addition, it is desirable to provide high density devices that can be readily manufactured using these methods.

SUMMARY OF THE INVENTION

Field effect transistors described herein include first and second terminals vertically separated by a channel region. The first and second terminals and the channel region are arranged vertically within different layers over a semiconductor body comprising silicon. The locations of the second terminal and channel region over the substrate overlap, or are aligned in a stack with, the locations of the first terminal. A gate terminal has an inside surface surrounding the channel region. A dielectric separates the channel region from the gate terminal.

As a result of the vertical arrangement provided by the overlapping first and second terminals and channel region within different layers over the substrate, the field effect transistors described herein have small cross-sectional areas.

The first terminal of field effect transistors as described herein comprises a first silicide element on the semiconductor body, and the second terminal comprises a second silicide element. The first silicide element prevents the migration of carriers from the first terminal into the underlying semiconductor body or adjacent devices which can activate parasitic devices. The first silicide element is also capable of acting as a low resistance conductive line for interconnecting devices or elements. The second silicide element provides a low resistance contact between the second terminal and overlying elements.

A method described herein for manufacturing a transistor includes providing a semiconductor body comprising silicon. The method further includes forming a first terminal on the semiconductor body, a second terminal overlying the first terminal, and a channel region separating the first and second terminals. Forming the first terminal comprises forming a first silicide element in the semiconductor body and separating the channel region from an underlying portion of the semiconductor body. The method also includes forming a gate terminal having an inside surface surrounding the channel region, and forming a dielectric separating the channel region from the gate terminal.

Other aspects and advantages of the present invention can be seen on review of the drawings, the detailed description, and the claims which follow.

DETAILED DESCRIPTION

A detailed description is provided with reference to FIGS. 1-13.

Figure 1A:
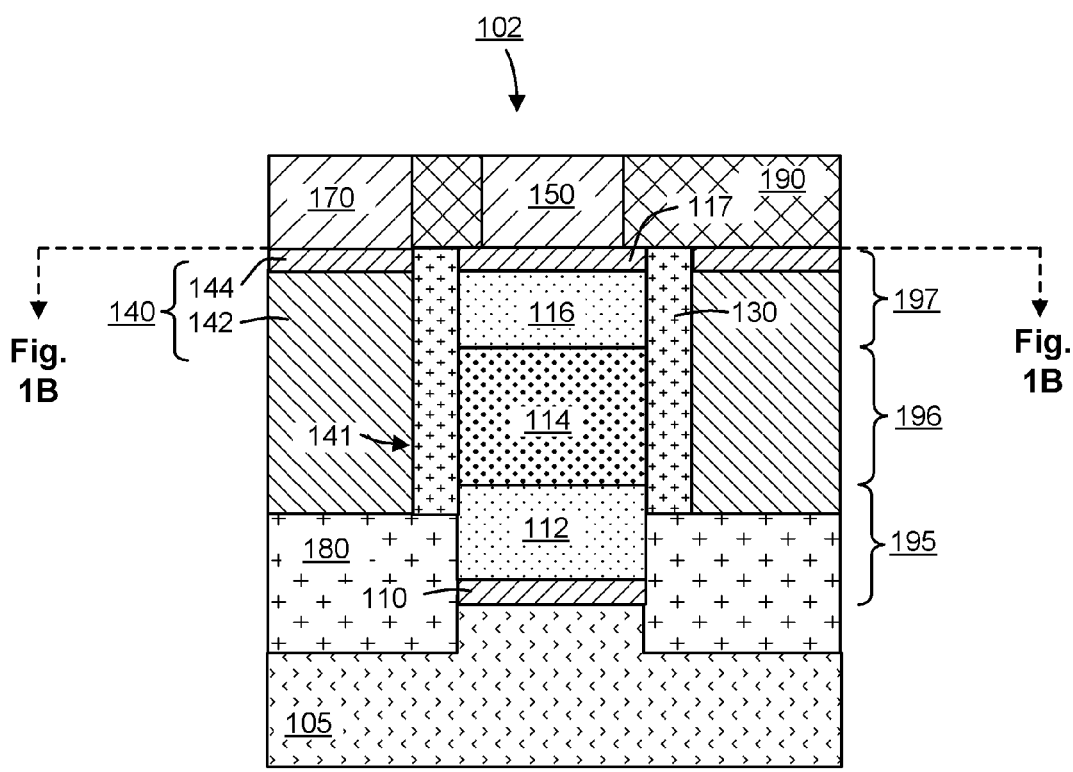
FIG. 1A is a cross-sectional view of a first embodiment of a vertical field effect transistor as described herein.
Figure 1B:
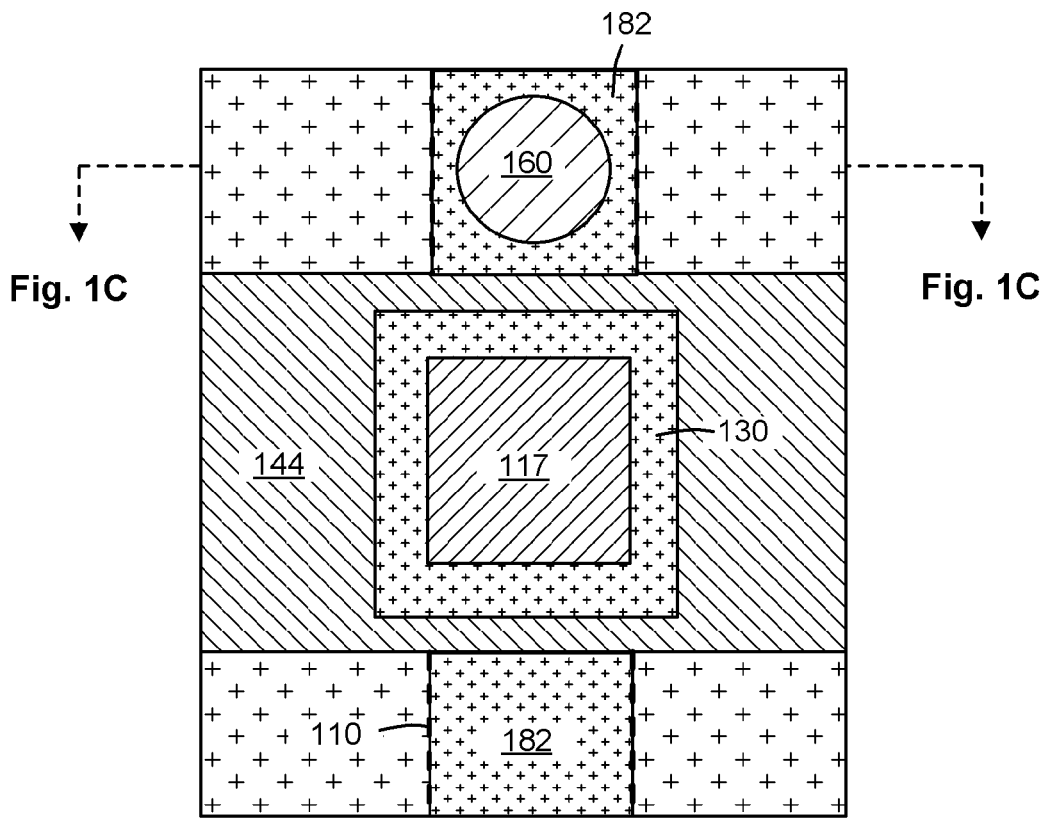
FIG. 1B is a top view of the vertical field effect transistor of FIG. 1A.
Figure 1C:
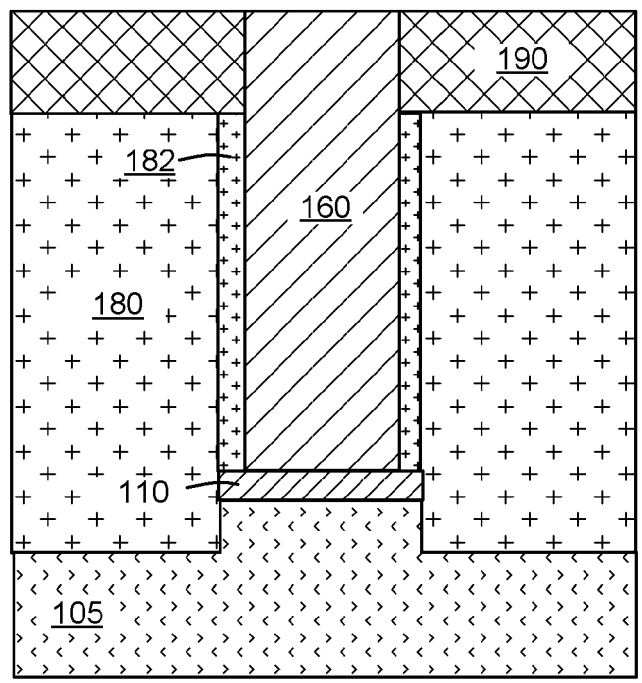
FIG. 1C is a cross-sectional view of the vertical field effect transistor of FIG. 1A taken on line FIG. 1C-1C of FIG. 1B.

FIG. 1A illustrates a cross-sectional view of a first embodiment of a vertical channel field effect transistor 102 for an integrated circuit device 100. FIG. 1B is a top view taken along the line FIG. 1B-FIG. 1B, and FIG. 1C is a cross-sectional view taken along the line FIG. 1C-1C. The transistor 102 can be implemented, for example, in logic and decoding circuitry in the periphery of a memory device. Alternatively, the transistor 102 may be an access device for a memory cell, such as for use in a programmable resistance memory array.

The device 100 includes a semiconductor body 105 comprising silicon. The semiconductor body 105 may be single crystalline silicon. A first silicide element 110 is on the semiconductor body 105 and extends into and out of the cross-section illustrated in FIG. 1A. The first silicide element 110 may comprise, for example, a silicide containing Ti, W, Co, Ni, or Ta. The first silicide element 110 provides a low resistance contact between the transistor 102 and a drain contact (see reference numeral 160, FIGS. 1B and 1C). The first silicide element 110 separates the first doped region 112 of the transistor 102 from the semiconductor body 105, preventing the migration of minority carriers from the first doped region 112 into the silicon body or adjacent devices which can activate parasitic devices in the integrated circuit device 100.

The device 100 includes a first layer 195 over the semiconductor body 105. The first layer 195 includes the first doped region 112 comprising doped semiconductor material on the silicide element 110. The first doped region 112 and a portion of the first silicide element 110 act as the first terminal of the transistor 102.

A second layer 196 is over the first layer 195 and includes the channel region 114 of the transistor 102 comprising doped semiconductor material on the first doped region 112. A third layer 197 is over the second layer 196 and includes a second doped region 116 comprising doped semiconductor material on the channel region 114. The channel region 114 comprises doped semiconductor material having a conductivity type different from that of the first and second doped regions 112, 116. In the illustrated embodiment the first and second doped regions 112 and 116 comprise doped N-type material, and the channel region 114 comprises doped P-type material.

A second silicide element 117 is on the second doped region 116. The second doped region 116 and second silicide element 117 act as the second terminal of the transistor 102. The second silicide element 117 may comprise, for example, a silicide containing Ti, W, Co, Ni, or Ta. The second silicide element 117 provides a low resistance contact between the doped semiconductor material of the second terminal 116 and a source contact 150. The source contact 150 may comprise for example tungsten. In alternative embodiments in which the transistor 102 is implemented in a memory array, the second silicide element 117 provides a low resistance contact between the doped semiconductor material of the second doped region 116 and an overlying element, such as a programmable resistance memory element.

As can be seen in FIG. 1A, the locations of the second terminal (second doped region 116 and second silicide element 117) and channel region 114 within respective layers 197 and 196 over the semiconductor body 105 overlap the location of the first terminal (first doped region 116 and an underlying portion of first silicide element 110) within the layer 195. In the illustrated embodiment the first and second terminals and channel region 114 are aligned in a stack.

As a result of the vertical arrangement provided by the overlapping locations of the first and second terminals and channel region 114 within the different layers over the semiconductor body 105, the field effect transistor 102 has a small cross-sectional area.

The device 100 also includes a gate terminal 140 having an inside surface 141 surrounding the channel region 114. A gate dielectric 130 surrounds the channel region 114 to separate the gate terminal 140 from the channel region 114.

The stack formed from the first and second terminals and the channel region 114 extends through the gate terminal 140 to electrically couple the silicide element 110 to the source contact 150.

In the illustrated embodiment the gate terminal 140 comprises doped polysilicon material 142 and a silicide conductor 144 on the doped polysilicon material 142. A dielectric 180, comprising for example silicon dioxide, separates the gate terminal 140 from the semiconductor body 105.

A gate contact 170, comprising for example tungsten, is on the silicide conductor 144. The gate contact 170 and the source contact 150 extend through a dielectric layer 190. The dielectric layer 190 may comprise, for example, silicon dioxide.

In operation, voltages supplied to the gate terminal 140 and drain contact 160 can induce current to flow from the silicide element 110 to the source contact 150, or vice versa, via the first terminal, channel region 114, and second terminal. As shown in FIG. 1C, the drain contact 160 contacts the silicide element 110 and extends through dielectric 182. Dielectric 182 may comprise, for example, silicon dioxide.

In the top view of FIG. 1B the dielectric 130 and the stack formed from the first and second terminals and the channel region 114 have a square cross-section. However, in embodiments the dielectric 130 and stack may have a cross-section that is circular, elliptical, square, rectangular, or somewhat irregularly shaped, depending on the manufacturing technique applied to form them.

As can be seen in FIGS. 1A-1C, because of the vertical channel structure, the cross-sectional area of the transistor 102 is determined entirely by dimensions of the gate terminal 140. Thus, the transistor 102 can have a very small cross-section while also providing sufficient current to operate the transistor 102. The length of the channel is determined by the height of the channel region 114 and can be made small, while the width of the channel of the transistor 102 is dependent upon the circumference of the channel region 114 which can be made relatively large compared to the length. Thus, a relatively large width-to-length ratio can be achieved.

FIGS. 2A-2B to 10A-10C illustrate steps in a fabrication sequence suitable for manufacturing the vertical transistor 102 of FIGS. 1A-1C.

Figure 2A:
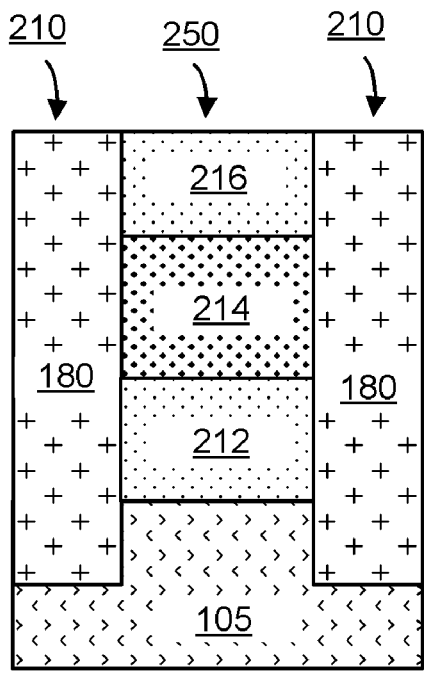
FIG. 2A illustrates a cross-section of a semiconductor body corresponding to a stage in a fabrication sequence with isolation structures and a strip of doped semiconductor material.
Figure 2B:
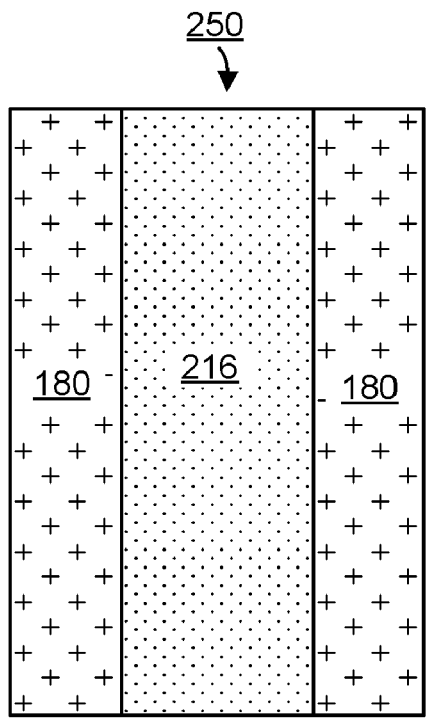
FIG. 2B illustrates a top view of the structure of FIG. 2A.

FIGS. 2A and 2B illustrate respective cross-sectional and top views of forming a semiconductor body 105 including forming isolation structures 210 comprising dielectric 180 to define strip 250 of doped semiconductor material. In this example the semiconductor body 105 is single crystal silicon, and can be formed using silicon-on-insulator techniques or the like. Alternatively, the semiconductor body 105 may for example be polycrystalline silicon. The trench isolation structures 210 within the semiconductor body 105 can be implemented, for example, using shallow trench isolation technology by etching trenches in the semiconductor body 105, filling the trenches with isolation material, and performing a planarizing process such as Chemical Mechanical Polishing CMP.

The strip 250 includes a lower portion 212 used to form the first doped region 112 of the vertical transistor, a middle portion 214 used to form the channel region 114, and an upper portion 216 used to form the second doped region 116. The lower, middle, and upper portions can be formed by implanting dopants into the semiconductor body 105 before or after formation of the isolation structures 210.

In the illustrated embodiment, the upper and lower portions 216, 212 comprise doped N-type material, and the middle portion 214 comprises doped P-type material.

Figure 3A:
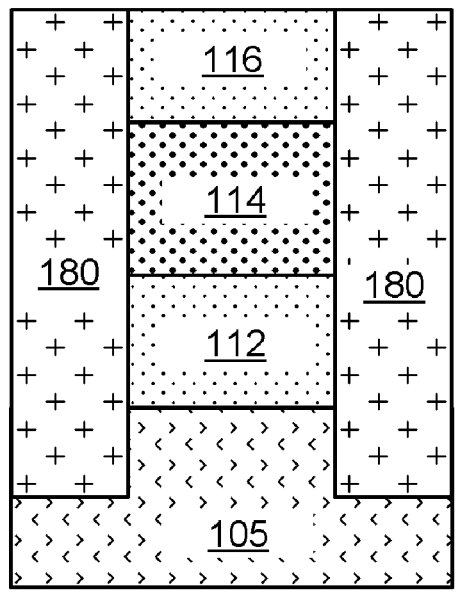
FIG. 3A is a cross-section of a semiconductor body corresponding to a stage in the fabrication sequence after a patterning step to form stacks, taken on the line FIG. 3A-3A of FIG. 3B.
Figure 3B:
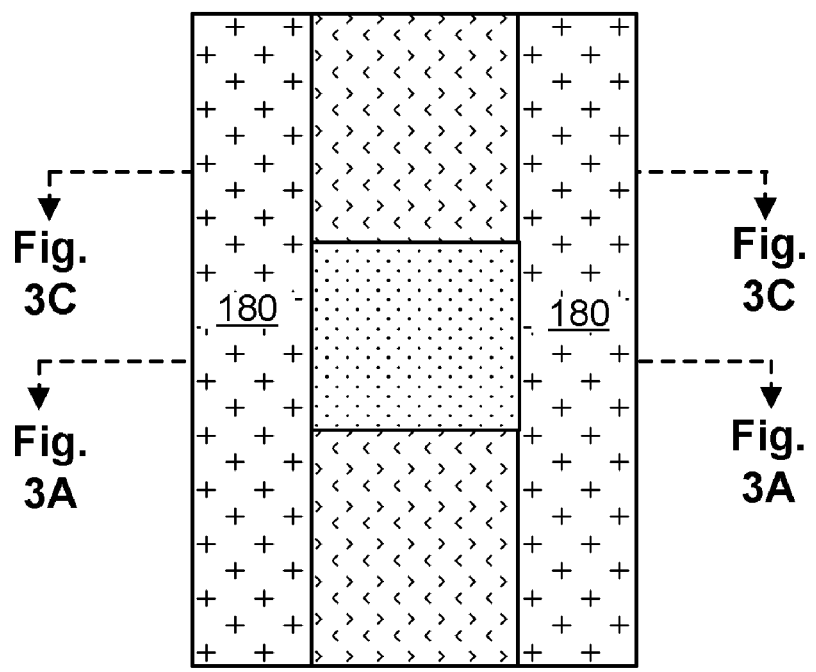
FIG. 3B is a top view of the semiconductor body of FIG. 3A illustrating a location of the stacks.
Figure 3C:
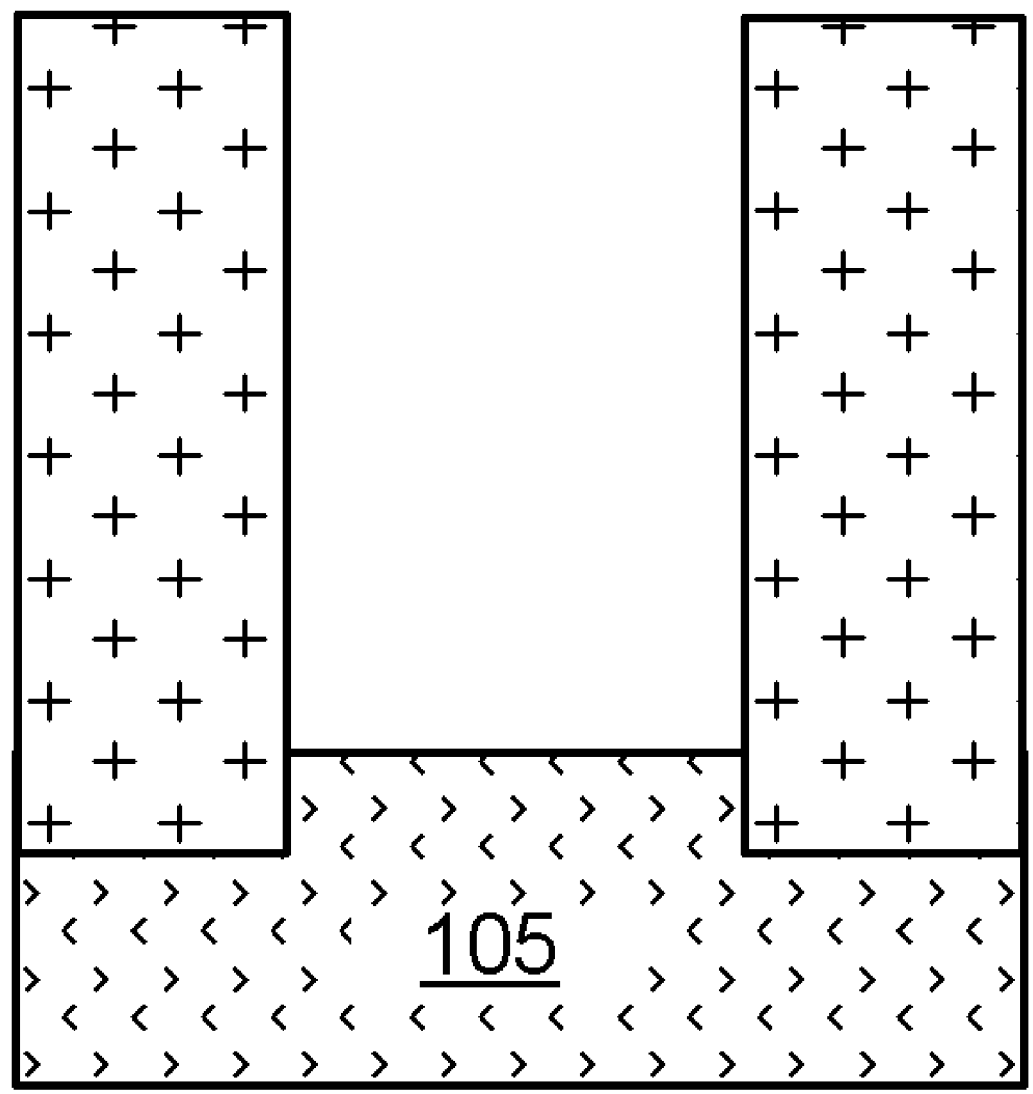
FIG. 3C is a cross-section of the semiconductor body of FIG. 3A, between stacks, taken on the line FIG. 3C-3C of FIG. 3B.

Next, the strip 250 is patterned to expose portions of the semiconductor body 105 and form a stack consisting of the first and second doped regions 112, 116 and channel region 114, resulting in the structure illustrated in the top view of FIG. 3B and the cross-sectional views of FIGS. 3A and 3C. The strip 250 can be patterned, for example, by forming a layer of patterned photoresist on the structure in FIGS. 2A-2B, and etching the strip 250 using the patterned layer as an etch mask.

Figure 4A:
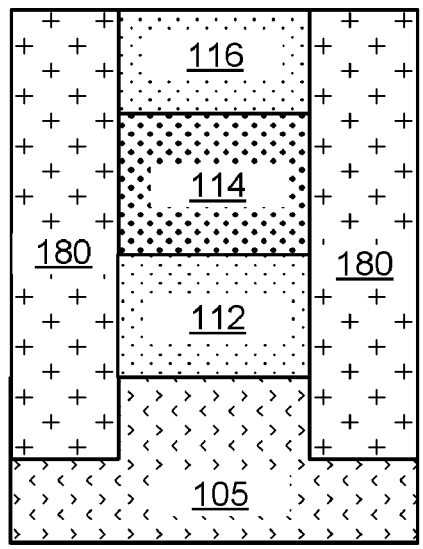
FIG. 4A is a cross-section of a semiconductor body corresponding to a stage in the fabrication sequence after formation of a dielectric sidewall layer, taken on the line FIG. 4A-4A of FIG. 4B.
Figure 4B:
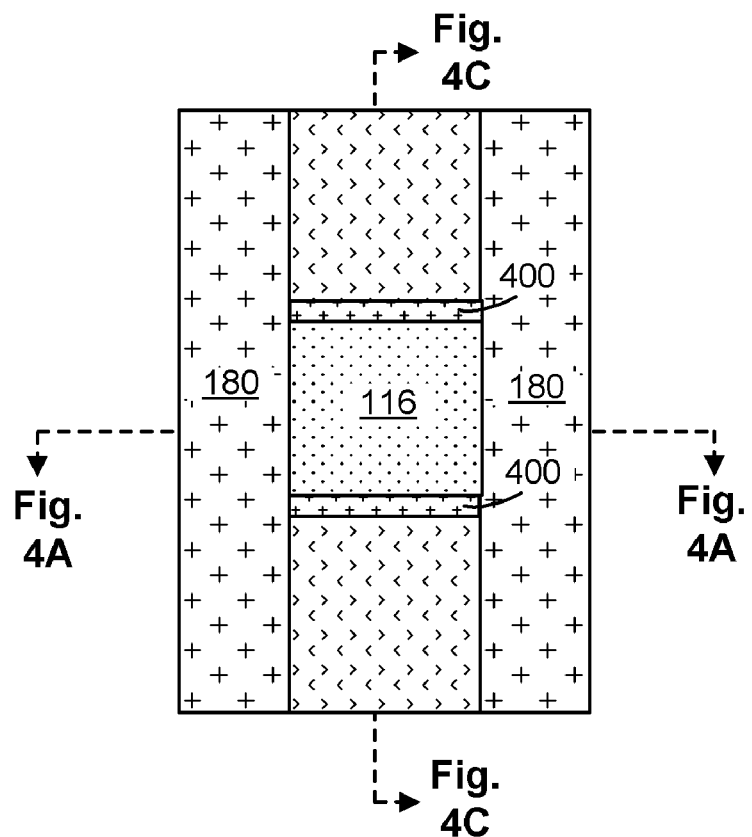
FIG. 4B is a top view of the semiconductor body of FIG. 4A.
Figure 4C:
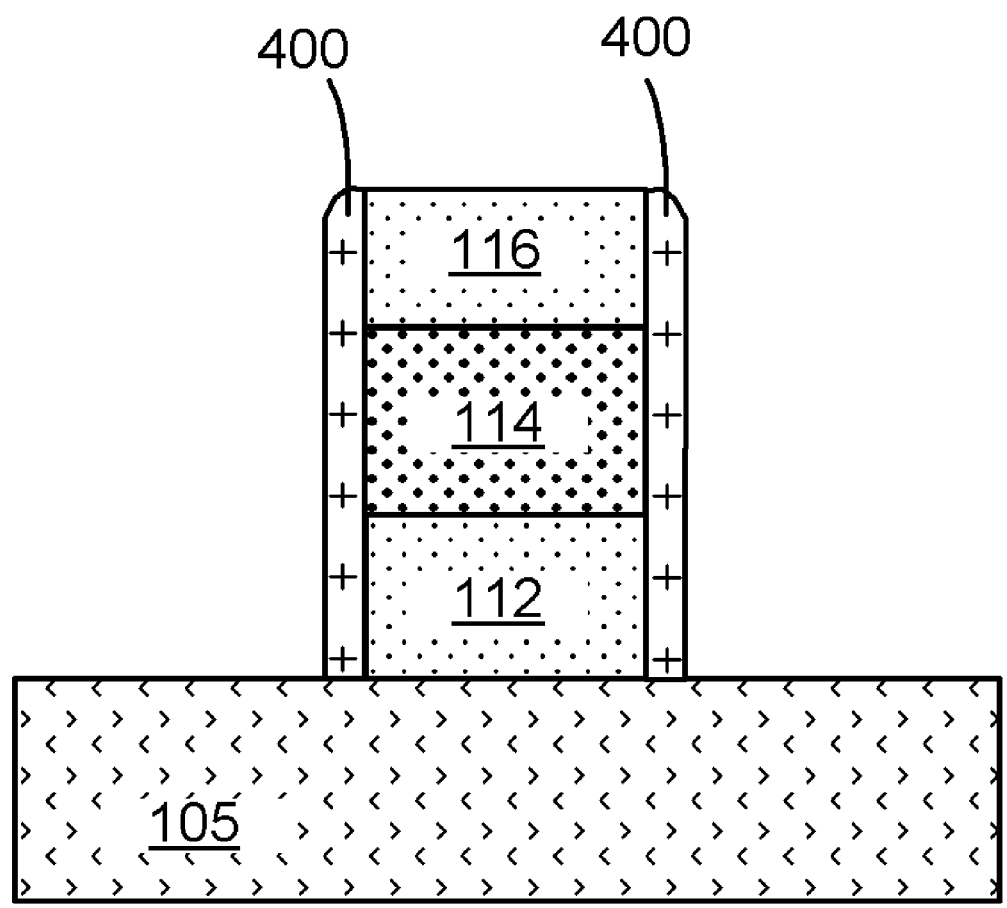
FIG. 4C is a cross-section of the semiconductor body of FIG. 4A, orthogonal to that of FIG. 4A, taken on the line FIG. 4C-4C of FIG. 4B.

Next, dielectric spacers 400 are formed on the exposed sidewalls of the first and second doped regions 112, 116 and channel region 316, resulting in the structure illustrated in the top view of FIG. 4B and the cross-sectional views of FIGS. 4A and 4C. The dielectric spacers 400 are used to protect the sidewalls of the first and second doped regions and the channel regions from the subsequent silicide formation process. The dielectric spacers 400 can be formed by depositing a conformal layer of dielectric on the structure illustrated in FIGS. 3A-3C, followed by anisotropically etching the dielectric.

Next, a layer of silicide precursor is formed on the structure of FIGS. 4A-4C including on the dielectric spacers 400 and the exposed semiconductor body 105. The silicide precursor may comprise, for example, cobalt, titanium, tungsten, nickel, molybdenum, platinum, and tantalum. Next, a rapid thermal process (RTP) is performed to induce formation of first silicide element 110 by reaction of the silicide precursor with the silicon of the semiconductor body 105. The remaining un-reacted silicide precursor is then removed, resulting in the structure illustrated in the top view of FIG. 5B and the cross-sectional views of FIGS. 5A and 5C.

Figure 5A:
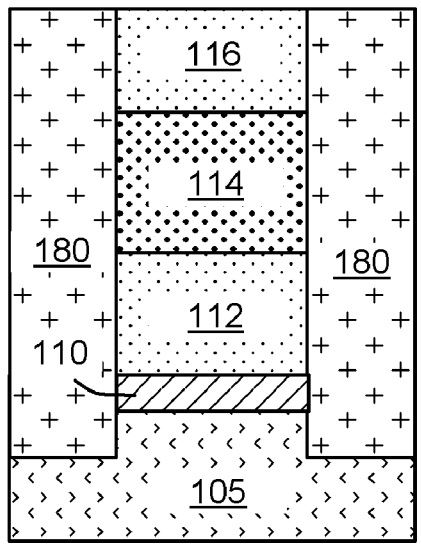
FIG. 5A is a cross-section of a semiconductor body corresponding to a stage in the fabrication sequence after a silicide formation step, taken on the line FIG. 5A-5A of FIG. 5B.
Figure 5B:
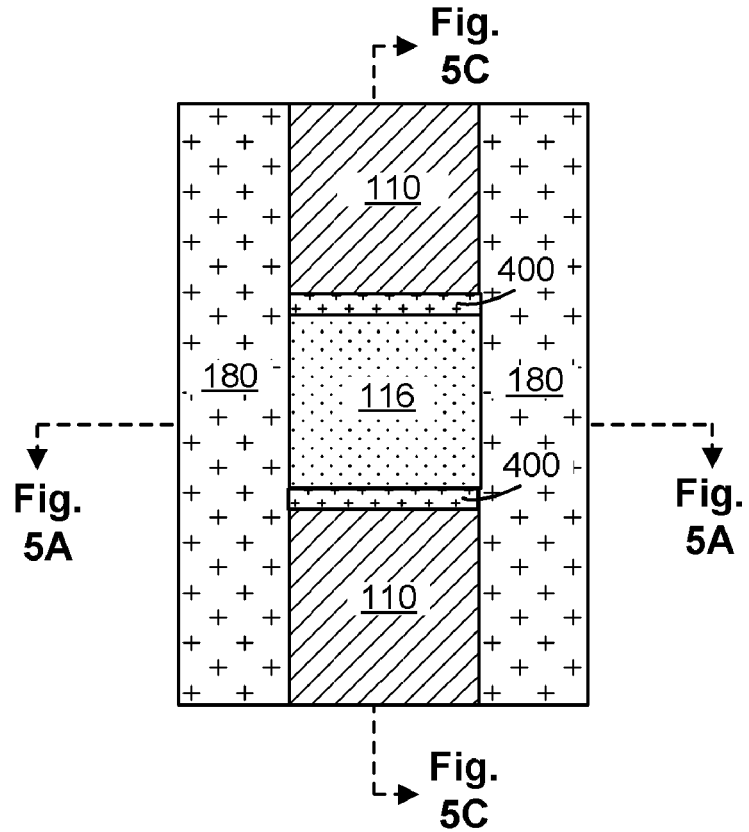
FIG. 5B is a top view of the semiconductor body of FIG. 5A.
Figure 5C:
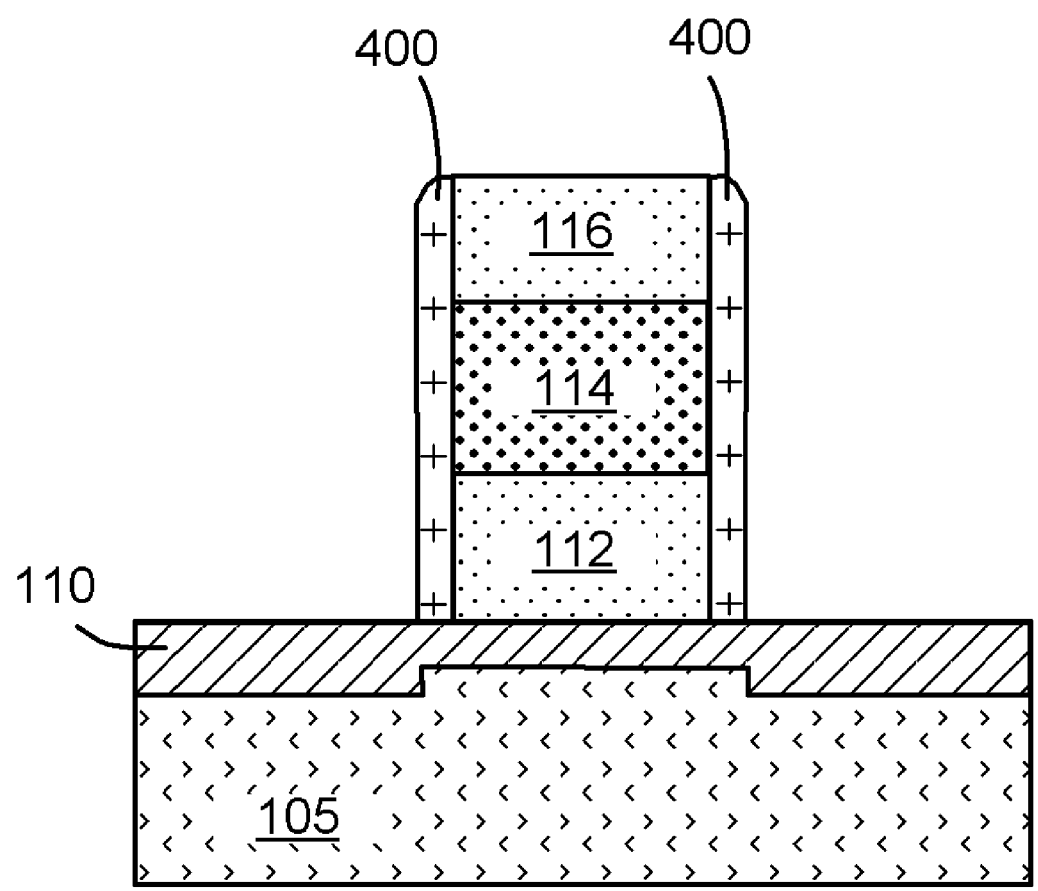
FIG. 5C is a cross-section of the semiconductor body of FIG. 5A, orthogonal to that of FIG. 5A, taken on the line FIG. 5C-5C of FIG. 5B.

As can be seen in FIGS. 5A-5C, the formation of the silicide element 110 consumes silicon of the semiconductor body 105 until the silicide element 110 extends underneath the first doped region 112. The width of the silicide precursor on the dielectric spacers 400 is sufficient to cause formation through at least half the width of the first doped region 112 so that silicide growth into the substrate on both sidewalls connects beneath the first doped region 112. The width which can implemented depends upon the particular silicide chosen, and the depth of growth into the semiconductor body 105.

As a basic reference, typical silicide growth has been characterized as forming silicide that is about 2.5 times thicker than the precursor, with growth into the silicon being about 1.5 times the thickness of the precursor.

Figure 6A:
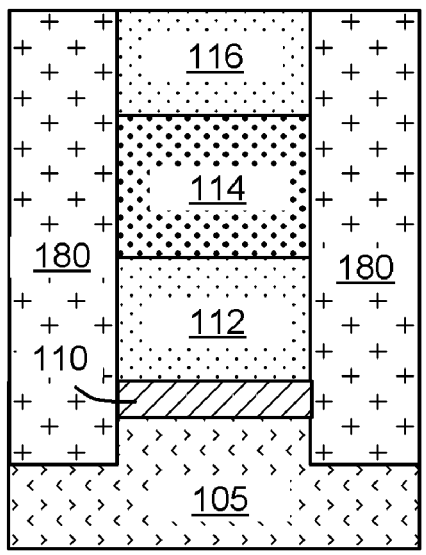
FIG. 6A is a cross-section of a semiconductor body corresponding to a stage in the fabrication sequence after a dielectric fill step, taken on the line FIG. 6A-6A of FIG. 6B.
Figure 6B:
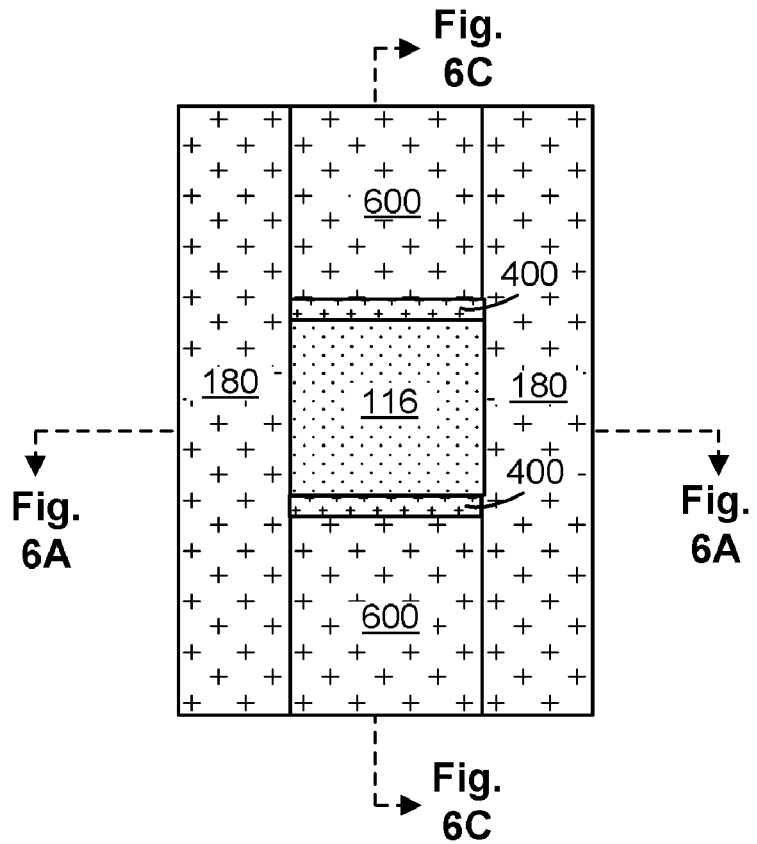
FIG. 6B is a top view of the semiconductor body of FIG. 6A.
Figure 6C:
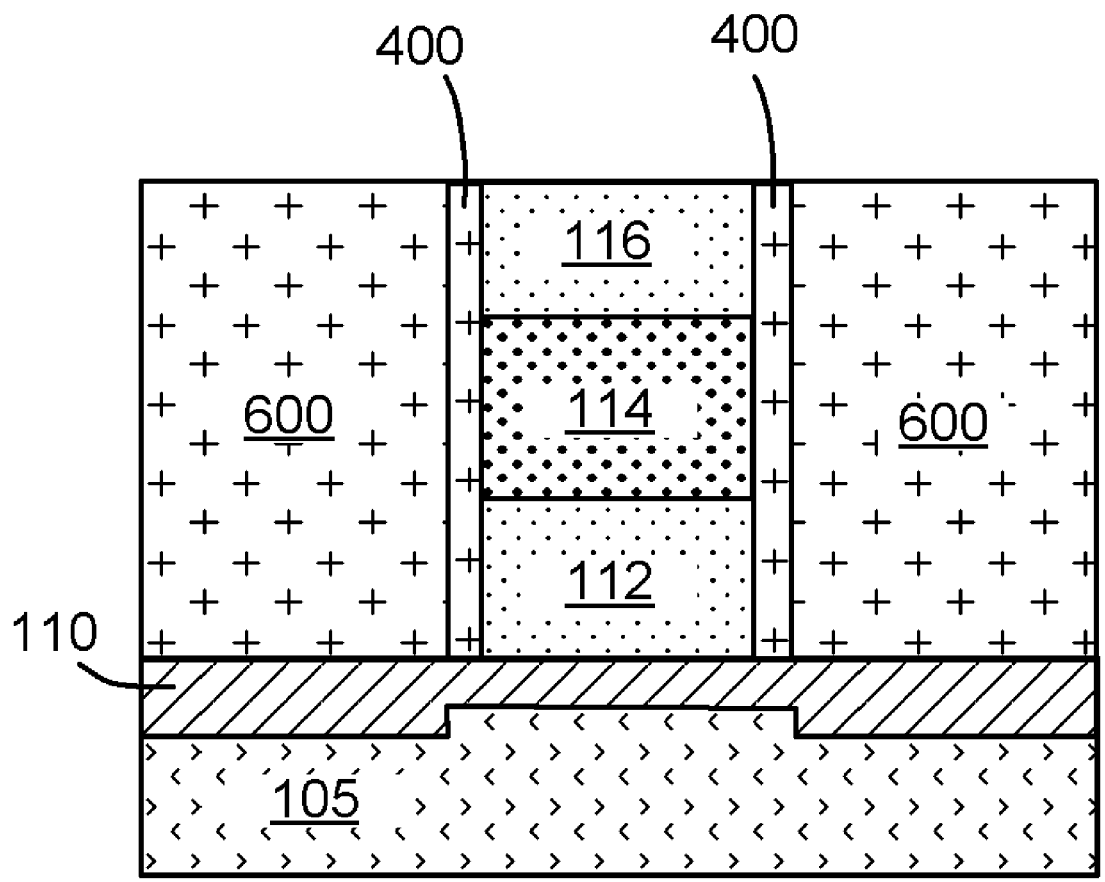
FIG. 6C is a cross-section of the semiconductor body of FIG. 6A, orthogonal to that of FIG. 6A, taken on the line FIG. 6C-6C of FIG. 6B.

Next, fill dielectric 600 is formed on the structure illustrated in FIGS. 5A-5C, resulting in the structure illustrated in the top view of FIG. 6B and the cross-sectional views of FIGS. 6A and 6C. The dielectric 600 may comprise, for example, silicon dioxide, and may be formed by depositing the dielectric 600 and performing a planarization process such as CMP.

Figure 7A:
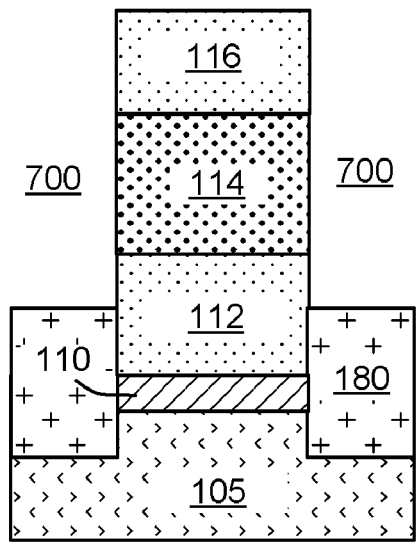
FIG. 7A is a cross-section of a semiconductor body corresponding to a stage in the fabrication sequence after an etch back exposing a top portion of the stacks, taken on the line FIG. 7A-7A of FIG. 7B.
Figure 7B:
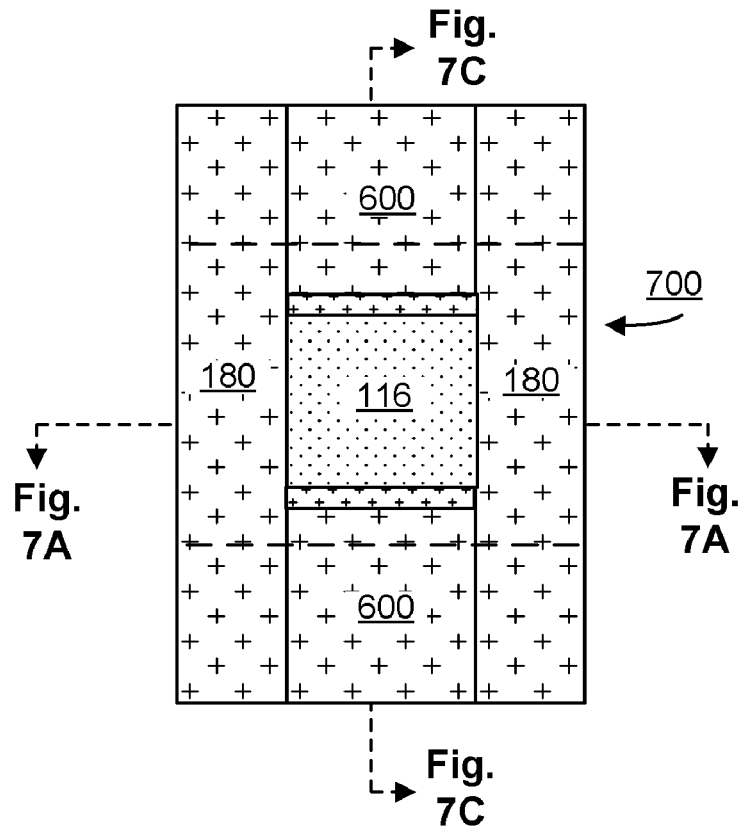
FIG. 7B is a top view of the semiconductor body of FIG. 7A.
Figure 7C:
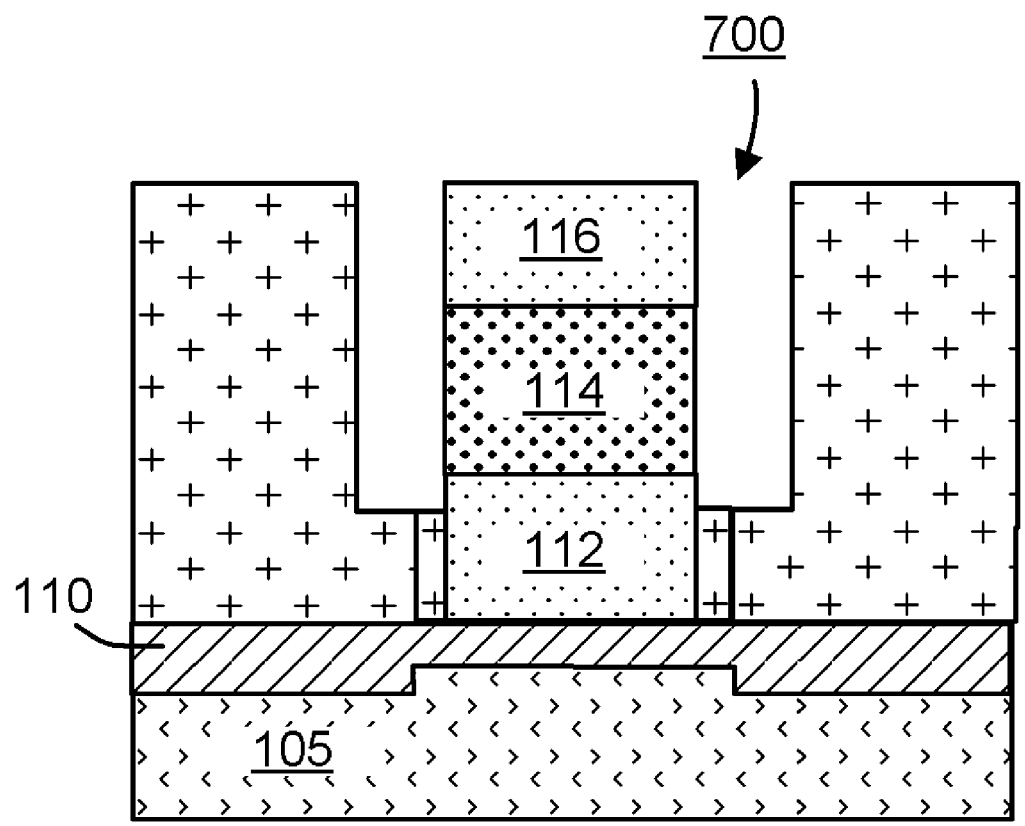
FIG. 7C is a cross-section of the semiconductor body of FIG. 7A, orthogonal to that of FIG. 7A, taken on the line FIG. 7C-7C of FIG. 7B.

Next a trench 700 is formed in the structure illustrated in FIGS. 6A-6C by removing portions of dielectric 180 and 600 and spacers 400 to expose outer surfaces of the first and second doped regions 112, 116 and channel region 114, resulting in the structure illustrated in the top view of FIG. 7B and cross-sectional views of FIGS. 7A and 7C. The trench 700 is used to define the location of the subsequently formed gate dielectric 130 and gate terminal 140.

The trench 700 can be formed, for example, by forming a layer of patterned photoresist on the structure in FIGS. 6A-6C, and etching the structure using the patterned layer as an etch mask.

Figure 8A:
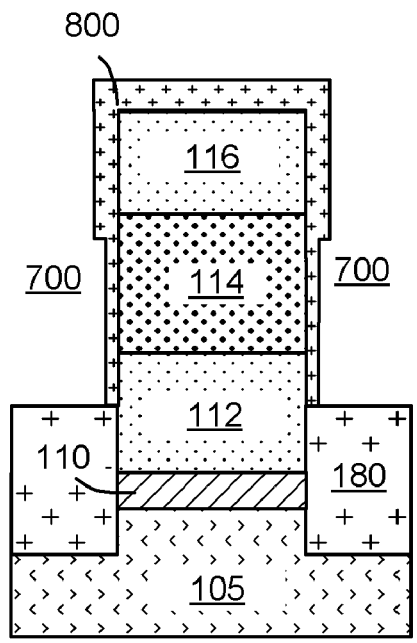
FIG. 8A is a cross-section of a semiconductor body corresponding to a stage in the fabrication sequence after formation of the gate dielectric layer, taken on the line FIG. 8A-8A of FIG. 8B.
Figure 8B:
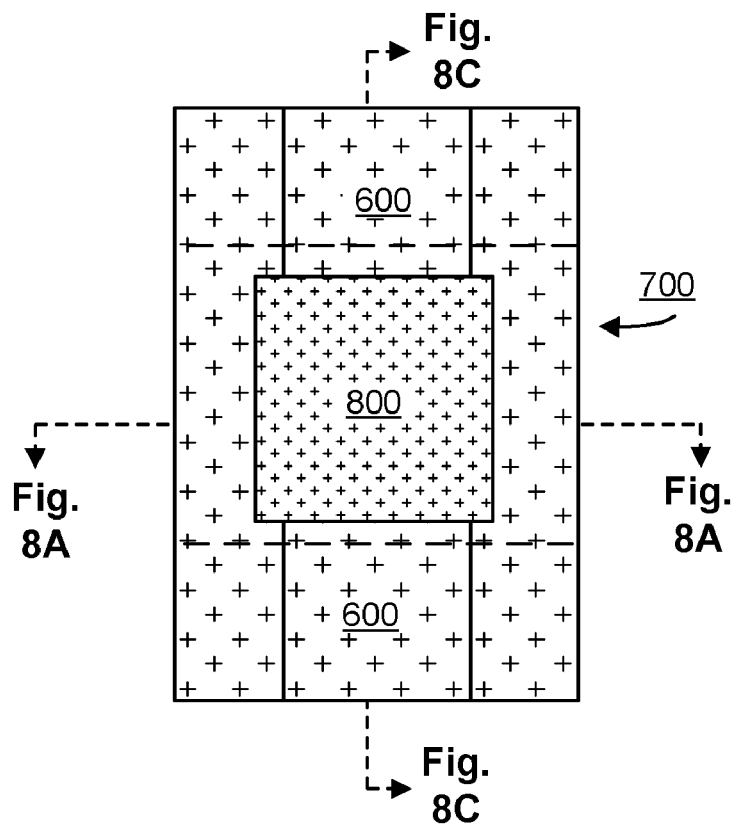
FIG. 8B is a top view of the semiconductor body of FIG. 8A.
Figure 8C:
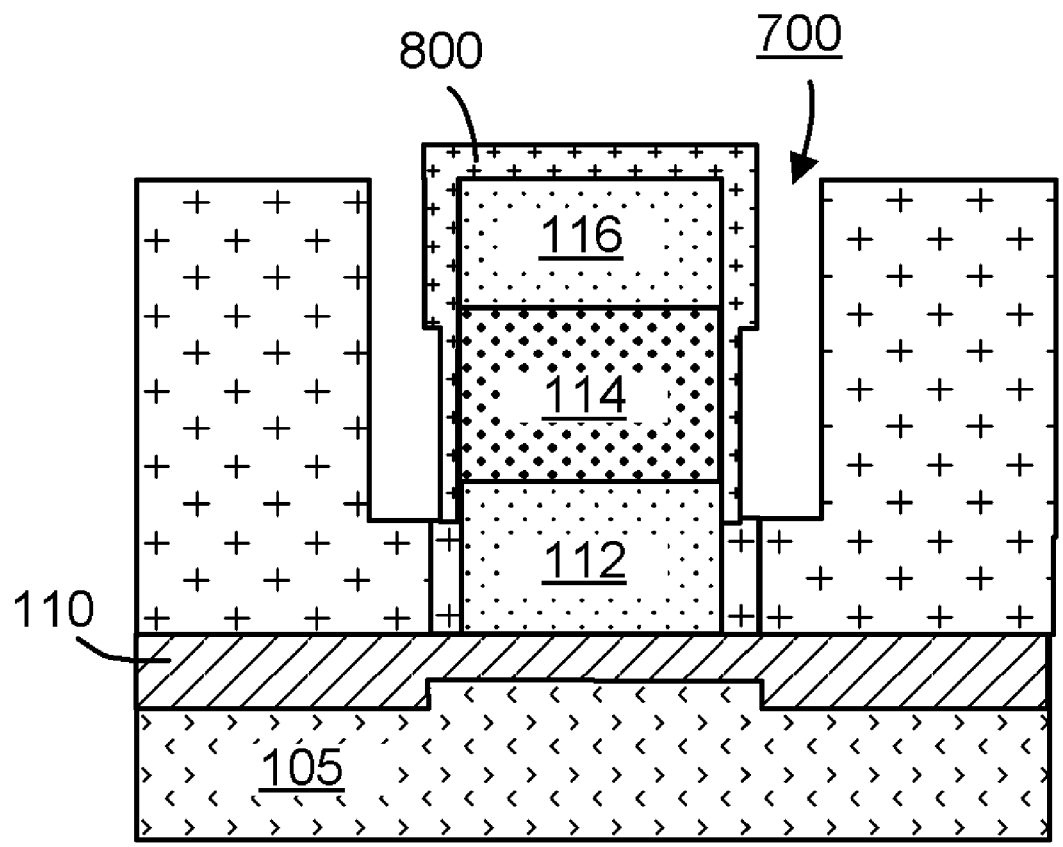
FIG. 8C is a cross-section of the semiconductor body of FIG. 8A, orthogonal to that of FIG. 8A, taken on the line FIG. 8C-8C of FIG. 8B.

Next, dielectric 800 is grown on the exposed outer surfaces of the first and second doped regions 112, 116 and channel region 114, resulting in the structure illustrated in the top view of FIG. 8B and the cross-sectional views of FIGS. 8A and 8C.

Figure 9A:
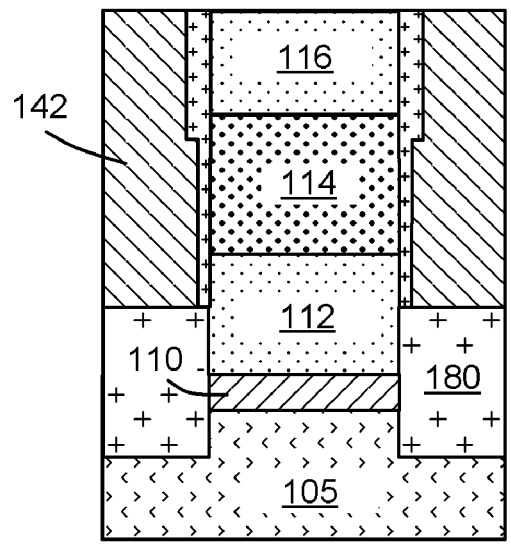
FIG. 9A is a cross-section of a semiconductor body corresponding to a next stage in the fabrication sequence after a step to form conductive material over the gate dielectric layer, taken on the line FIG. 9A-9A of FIG. 9B.
Figure 9B:
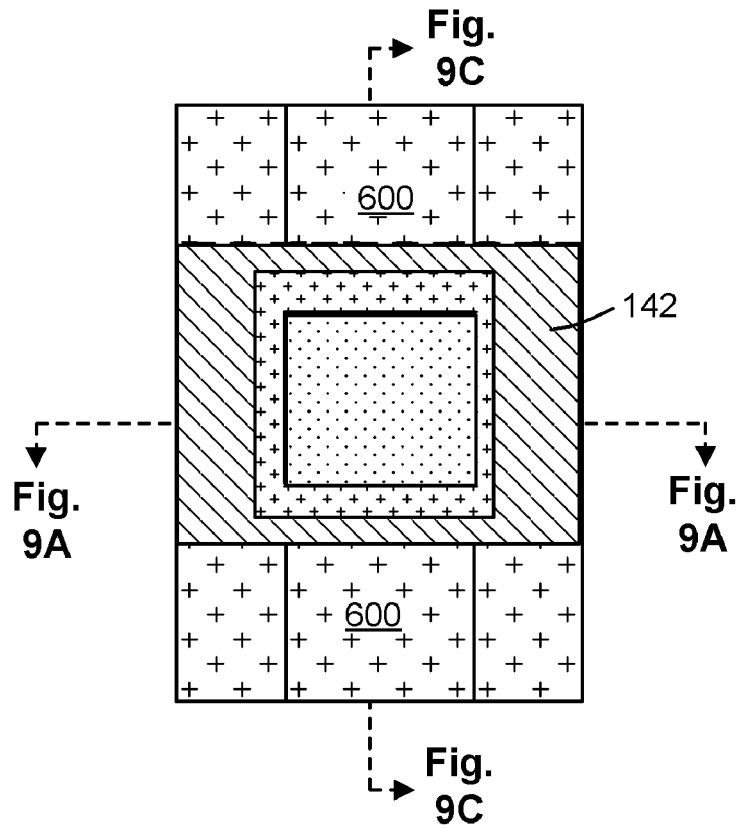
FIG. 9B is a top view of the semiconductor body of FIG. 9A.
Figure 9C:
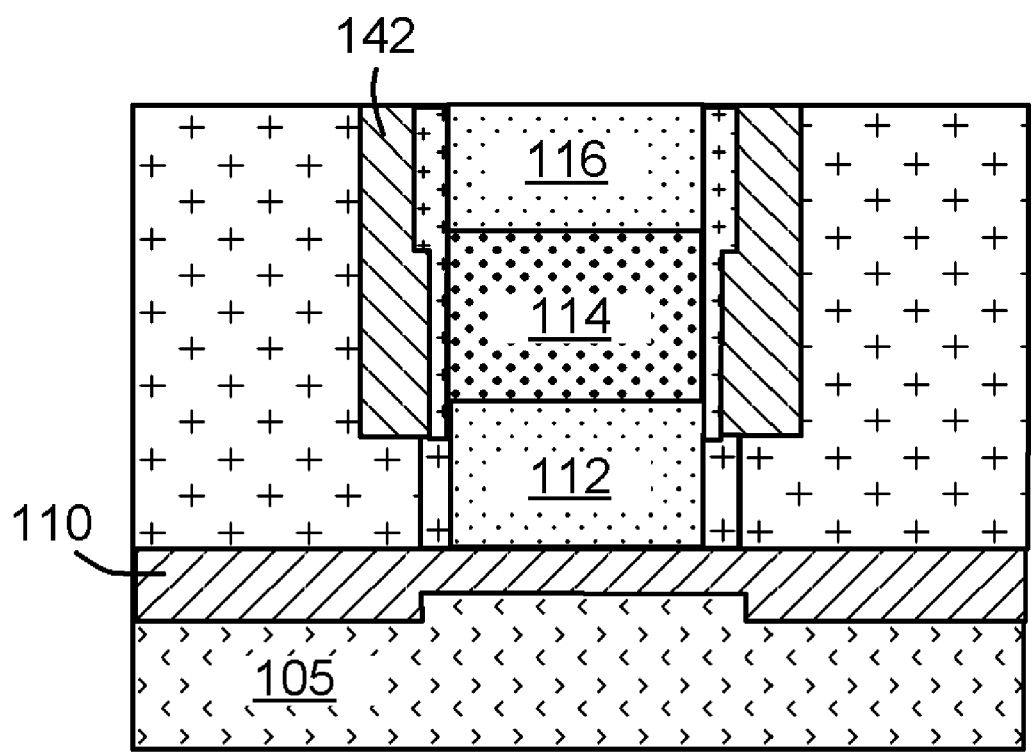
FIG. 9C is a cross-section of the semiconductor body of FIG. 9A, orthogonal to that of FIG. 9A, taken on the line FIG. 9C-9C of FIG. 9B.

Next, conductive material, for example doped polysilicon, is deposited on the structure illustrated in FIGS. 8A-8C, and planarized to expose a top surface of the second doped region 116 and form conductor 142 within the trench 700, resulting in the structure illustrated in the top view of FIG. 9B and the cross-sectional views of FIGS. 9A and 9C. Alternatively, metal material may be deposited.

Figure 10A:
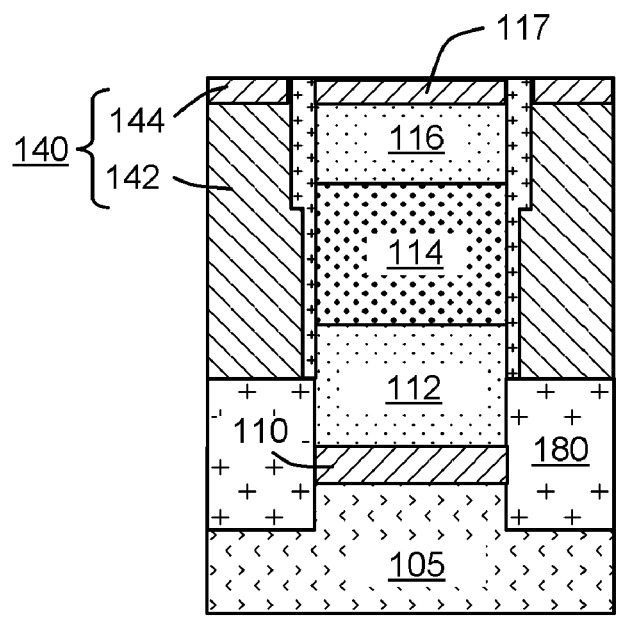
FIG. 10A is a cross-section of a semiconductor body corresponding to a stage in the fabrication sequence after a silicide formation step, taken on the line FIG. 10A-10A of FIG. 10B.
Figure 10B:
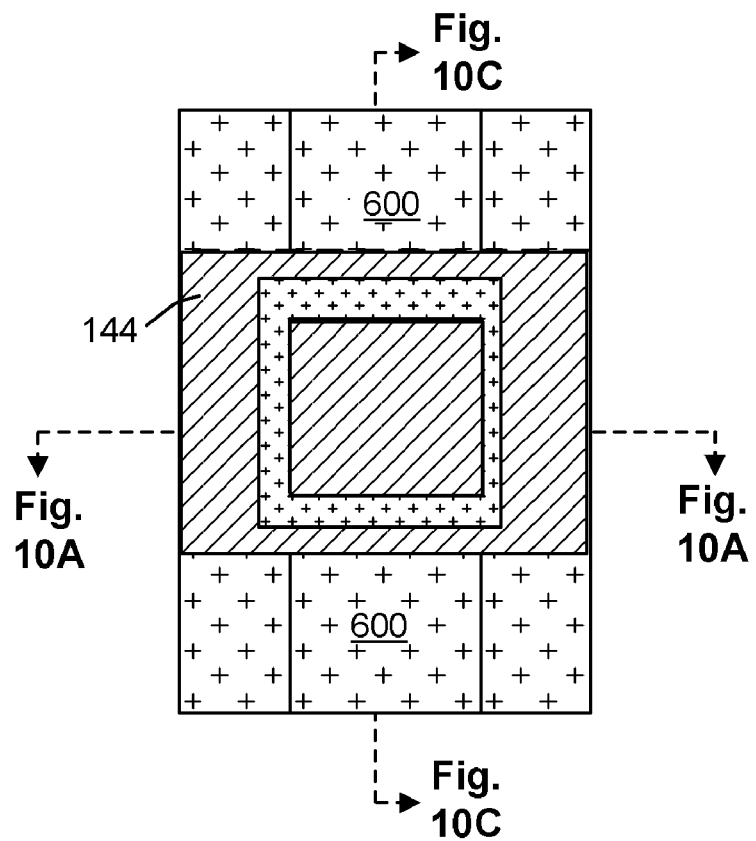
FIG. 10B is a top view of the semiconductor body of FIG. 10A.
Figure 10C:
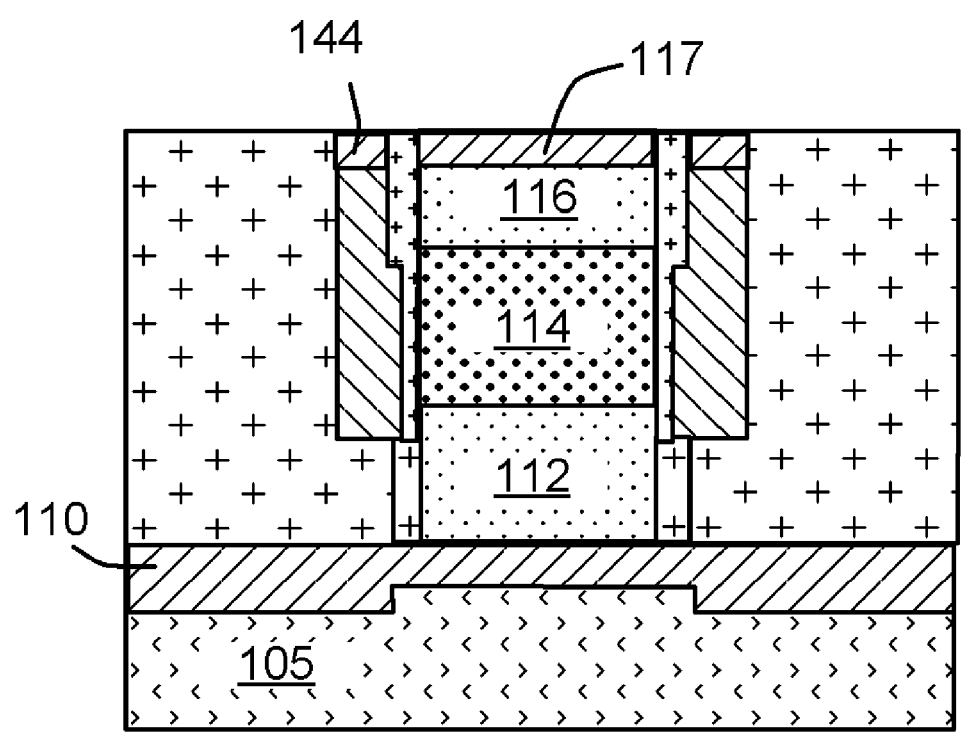
FIG. 10C is a cross-section of the semiconductor body of FIG. 10A, orthogonal to that of FIG. 10A, taken on the line FIG. 10C-10C of FIG. 10B.

A silicide process is then performed to form the second silicide element 117 on the second doped region 116 and form silicide conductor 144 on the conductor 142 to define gate terminal 140, resulting in the structure illustrated in the top view of FIG. 10B and cross-sectional views of FIGS. 10A and 10C. The silicide process includes depositing a silicide precursor on the structure of FIGS. 9A-9C and performing RTP such that the silicide precursor reacts with the silicon of the second doped region 116 and the silicon of conductor 142 to form elements 117 and 144.

Next, dielectric 190 is formed on the structure illustrated in FIGS. 10A-10C and contacts 150, 160, and 170 are formed, resulting in the device illustrated in FIGS. 1A-1C.

Figure 11:
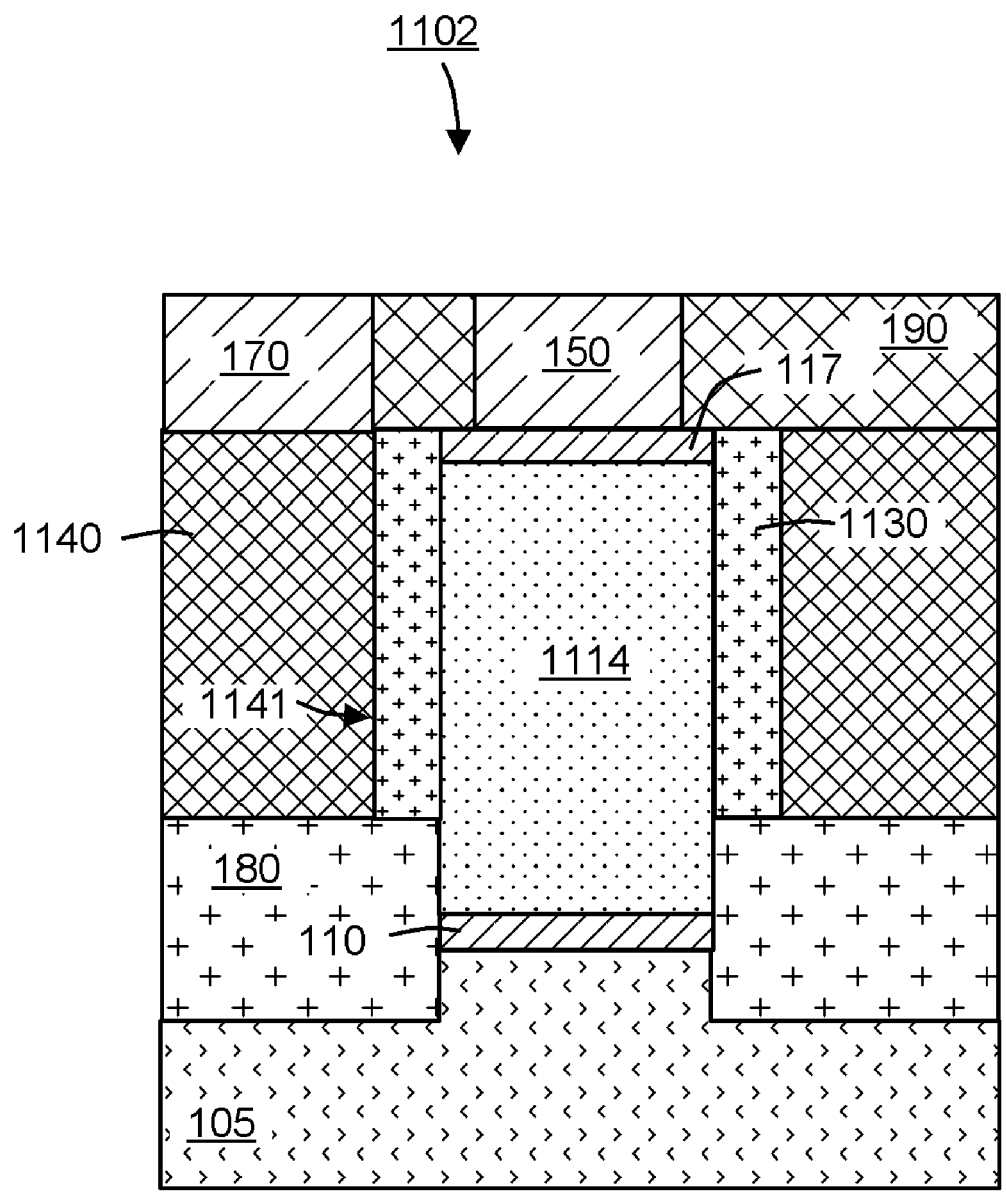
FIG. 11 illustrates a cross-sectional view of a second embodiment of a vertical channel field effect transistor which includes an intrinsically doped channel region.

FIG. 11 illustrates a cross-sectional view of a second embodiment of a vertical channel field effect transistor 1102 which includes an intrinsically doped channel region 1114 extending between the first and second silicide elements 110, 117. The first and second silicide elements 110, 117 act as the first and second terminals of the transistor 102. In the illustrated embodiment the channel region 1114 is intrinsically doped silicon.

The gate terminal 1140 has an inside surface 1141 surrounding the channel region 1114. Gate dielectric 1130 separates the gate terminal 1140 from the channel region 1114.

In the illustrated embodiment, the gate terminal 1140 is a metal material and the gate dielectric 1130 is a high-k dielectric material having a k greater than 3.9, the "k" of silicon dioxide. For example, the gate dielectric 130 may comprise hafnium oxide, zirconium oxide, or titanium oxide. The metal material of the gate terminal 1140 can be selected so that the transistor 1102 can operate as a PMOS or NMOS transistor. For example, the gate terminal 1140 may be TiN so that the transistor 1102 operates as a PMOS transistor, and as another example may be TiAlN so that the transistor 102 operates as an NMOS transistor. See, "45 nm High-k+Metal Gate Strain-Enhanced Transistors", Intel Technology Journal, Volume 12, Issue 2, 2008, pp 77-85.

Figure 12A:
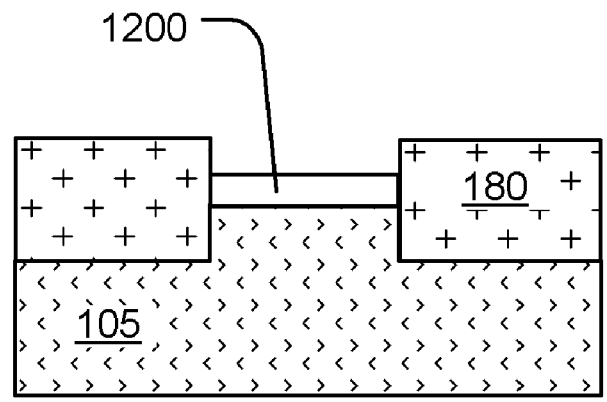
FIG. 12A illustrates a first stage in a manufacturing method based on nano-wire growth techniques.
Figure 12B:
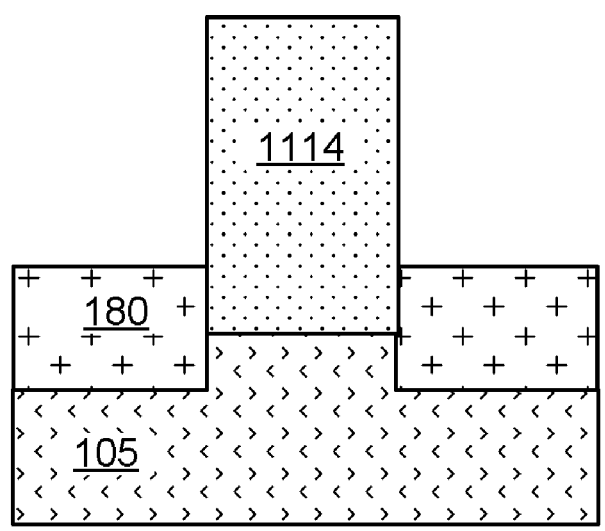
FIG. 12B illustrates a second stage in a nano-wire growth manufacturing method after the stage shown in FIG. 12A.

FIGS. 12A-12B illustrates steps in an embodiment for manufacturing the channel region 1114 using a nano-wire growth technique.

FIG. 12A illustrates a first step of forming a catalyst 1200 on the semiconductor body 105. The catalyst 1200 comprises material that facilitates growth of the nano-wire channel region 1114 on the semiconductor body 105. For example, the catalyst 1200 may comprise material which facilitates formation of Si or Ge for the channel region 1114. When growing a nano-wire channel region 1114 comprising silicon, the material of the deposited catalyst 1200 may include, for example, gold, nickel, titanium, iron, cobalt, gallium, and respective alloys thereof. The catalyst 1200 may be deposited, for example, using physical vapor or chemical vapor techniques.

FIG. 12B illustrates growing the channel region 1114 at the site of the catalyst 1200. Growing can comprise, for example, exposing the catalyst 1200 to a controlled temperature, pressure, and gas containing a material of the nano-wire channel region 1114 to be grown.

Exemplary methods for forming the catalyst 1200 and growing the channel region 1114 are disclosed in U.S. Pat. Nos. 6,831,017 and 6,720,240, and US Patent Publication No. 2003/0189202, each of which are incorporated by reference herein. In alternative embodiments the channel region 1114 may be grown using a catalyst-free nano-wire growth technique.

Figure 13:
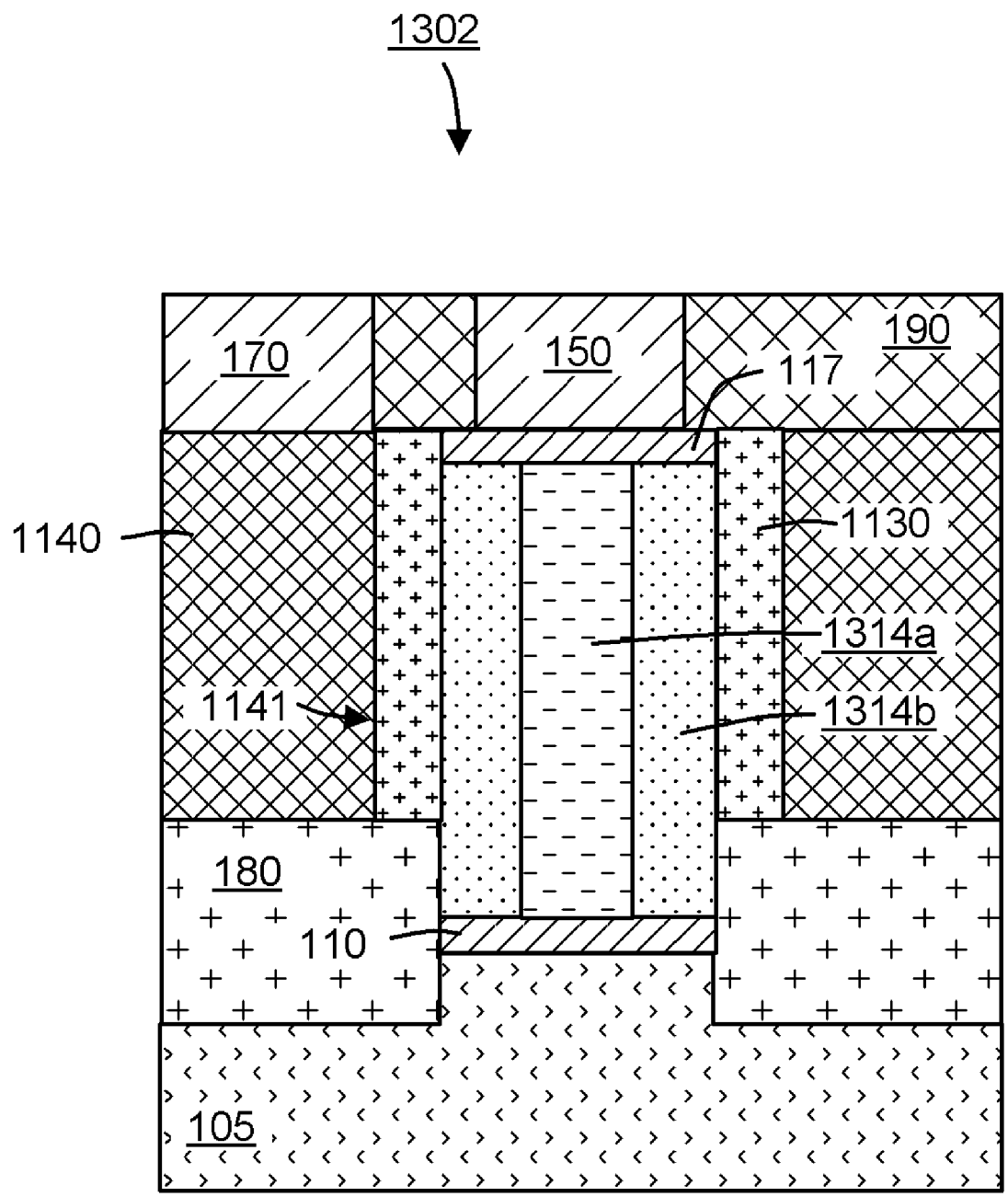
FIG. 13 illustrates a cross-sectional view of a third embodiment of a vertical channel field effect transistor which includes a channel region having a core of germanium, and a silicon shell surrounding the core.

FIG. 13 illustrates a cross-sectional view of a third embodiment of a vertical channel field effect transistor 1302 which includes a nano-wire channel region having a core 1314a of germanium, and a silicon shell 1314b surrounding the core 1314a. The core 1314a and shell 1314b of the nano-wire channel region 1314 can be grown on the semiconductor body 105, for example, using techniques described in "One-dimensional hole gas in germanium/silicon nanowire heterostructures" by Lu et al., Proc. Natl. Acad. Sci., vol. 102, no. 29, 19 July 2005, pp. 10046-10051.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A vertical transistor comprising:
   a first terminal of the transistor consisting of a first silicide element on a semiconductor body comprising silicon;
   a second terminal of the transistor overlying the first terminal and consisting of a second silicide element;
   a channel region of the transistor separating the first and second terminals;
   a gate terminal of the transistor having an inside surface completely surrounding the channel region; and
   a dielectric separating the channel region from the gate terminal.

2. A transistor comprising:
   a first terminal of the transistor comprising a first silicide element on a semiconductor body comprising silicon;

a second terminal of the transistor overlying the first terminal and comprising a second silicide element;
a channel region of the transistor separating the first and second terminals;
a gate terminal of the transistor having an inside surface surrounding the channel region; and
a dielectric separating the channel region from the gate terminal, wherein the channel region comprises intrinsically doped semiconductor material contacting the first and second silicide elements.

3. The transistor of claim 2, wherein:
the first terminal further comprises a first doped region on the first silicide element, the first silicide element separating the first doped region from the semiconductor body; and
the second terminal further comprises a second doped region underlying the second silicide element.

4. The transistor of claim 2, wherein the gate terminal is a metal material.

5. The transistor of claim 2, wherein the channel region comprises single crystal silicon.

6. A transistor comprising:
a first terminal of the transistor comprising a first silicide element on a semiconductor body comprising silicon;
a second terminal of the transistor overlying the first terminal and comprising a second silicide element;
a channel region of the transistor separating the first and second terminals;
a gate terminal of the transistor having an inside surface surrounding the channel region; and
a dielectric separating the channel region from the gate terminal, wherein the gate terminal comprises doped silicon material and a silicide conductor on the doped silicon material, the silicide conductor having a top surface co-planar with a top surface of the second silicide element.

7. The transistor of claim 6, further comprising a gate contact on the silicide conductor of the gate terminal.

8. A transistor comprising:
a first terminal of the transistor comprising a first silicide element on a semiconductor body comprising silicon;
a second terminal of the transistor overlying the first terminal and comprising a second silicide element;
a channel region of the transistor separating the first and second terminals;
a gate terminal of the transistor having an inside surface surrounding the channel region; and
a dielectric separating the channel region from the gate terminal, wherein the channel region has a core comprising germanium, and a shell surrounding the core comprising silicon.

9. A transistor comprising:
a first terminal of the transistor comprising a first silicide element on a semiconductor body comprising silicon;
a second terminal of the transistor overlying the first terminal and comprising a second silicide element;
a channel region of the transistor separating the first and second terminals;
a gate terminal of the transistor having an inside surface surrounding the channel region; and
a dielectric separating the channel region from the gate terminal; and
further comprising a source contact on the second silicide element of the second terminal.

10. A transistor comprising:
a first terminal of the transistor comprising a first silicide element on a semiconductor body comprising silicon;
a second terminal of the transistor overlying the first terminal and comprising a second silicide element;
a channel region of the transistor separating the first and second terminals;
a gate terminal of the transistor having an inside surface surrounding the channel region; and
a dielectric separating the channel region from the gate terminal; and
further comprising a drain contact on the first silicide element of the first terminal.

11. A method for manufacturing a transistor, the method comprising:
providing a semiconductor body comprising silicon;
forming a first terminal of the transistor on the semiconductor body, a second terminal of the transistor overlying the first terminal, and a channel region of the transistor separating the first and second terminals, wherein forming the first terminal comprises forming a first silicide element in the semiconductor body and separating the channel region from an underlying portion of the semiconductor body;
forming a gate terminal of the transistor having an inside surface surrounding the channel region; and
forming a dielectric separating the channel region from the gate terminal, wherein the channel region comprises intrinsically doped semiconductor material contacting the first and second silicide elements.

12. A method for manufacturing a transistor, the method comprising:
providing a semiconductor body comprising silicon;
forming a first terminal of the transistor on the semiconductor body, a second terminal of the transistor overlying the first terminal, and a channel region of the transistor separating the first and second terminals, wherein forming the first terminal comprises forming a first silicide element in the semiconductor body and separating the channel region from an underlying portion of the semiconductor body;
forming a gate terminal of the transistor having an inside surface surrounding the channel region; and
forming a dielectric separating the channel region from the gate terminal, wherein:
forming the first terminal further comprises forming a first doped region on the semiconductor body before forming the first silicide element, wherein forming the first silicide element separates the first doped region from the semiconductor body; and
forming the second terminal further comprises forming a second doped region on the channel region before forming the second silicide element, wherein forming the second silicide element comprises forming the second silicide element on the second doped region.

13. The method of claim 12, wherein the channel region comprises intrinsically doped semiconductor material contacting the first and second silicide elements.

14. The method of claim 12, wherein the gate terminal is a metal material.

15. The method of claim 12, wherein forming the first and second terminals and the channel region comprise:
implanting dopants into the semiconductor body and forming dielectric trenches in the semiconductor body to define a strip of doped semiconductor body material, the strip comprising upper and lower portions having a first conductivity type and a middle portion having a second conductivity type different from the first conductivity type;

patterning the strip of doped semiconductor material to form a stack comprising the first and second doped regions and the channel region, the patterning exposing portions of the semiconductor body adjacent the stack;

depositing a silicide precursor on the exposed portions of the semiconductor body adjacent the stack;

forming the first silicide element by inducing reaction of the silicide precursor with the semiconductor body to consume silicon of the semiconductor body until the first silicide element separate the stack from an underlying portion of the semiconductor body.

16. The method of claim 15 including forming dielectric spacers on exposed sidewalls of the stack before said depositing the silicide precursor.

17. The method of claim 16, further comprising:

removing portions of the dielectric spacers to expose an outer surface of the channel region;

forming the dielectric on the exposed outer surface of the channel region;

forming the gate terminal surrounding the dielectric.

18. The method of claim 17, wherein forming the gate terminal and forming the second silicide element comprise:

depositing doped polysilicon material on the dielectric and overlying the stack;

planarizing the doped polysilicon material to expose a top surface of the second doped region of the stack; and performing a silicide process to form the second silicide element on the second doped region and form a silicide conductor on the doped polysilicon material.

19. A method for manufacturing a transistor, the method comprising:

providing a semiconductor body comprising silicon;

forming a first terminal of the transistor on the semiconductor body, a second terminal of the transistor overlying the first terminal, and a channel region of the transistor separating the first and second terminals, wherein forming the first terminal comprises forming a first silicide element in the semiconductor body and separating the channel region from an underlying portion of the semiconductor body;

forming a gate terminal of the transistor having an inside surface surrounding the channel region; and forming a dielectric separating the channel region from the gate terminal, wherein:

forming the channel region comprises growing the channel region on the semiconductor body using a nano-wire growth technique.

20. A method for manufacturing a transistor, the method comprising:

providing a semiconductor body comprising silicon;

forming a first terminal of the transistor on the semiconductor body, a second terminal of the transistor overlying the first terminal, and a channel region of the transistor separating the first and second terminals, wherein forming the first terminal comprises forming a first silicide element in the semiconductor body and separating the channel region from an underlying portion of the semiconductor body;

forming a gate terminal of the transistor having an inside surface surrounding the channel region; and forming a dielectric separating the channel region from the gate terminal, wherein:

the channel region has a core comprising germanium, and a shell surrounding the core and comprising silicon.

* * * * *